United States Patent
Morosawa et al.

(12) 
(10) Patent No.: US 6,700,170 B1
(45) Date of Patent: Mar. 2, 2004

(54) INSULATED GATE TRANSISTOR HAVING A GATE INSULATOR CONTAINING NITROGEN ATOMS AND FLUORINE ATOMS

(75) Inventors: Narihiro Morosawa, Nara (JP); Hiroshi Iwata, Nara-ken (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/471,173

(22) Filed: Dec. 23, 1999

(30) Foreign Application Priority Data

Dec. 24, 1998 (JP) .......................................... 10-365861
Oct. 26, 1999 (JP) .......................................... 11-303836

(51) Int. Cl.[7] .......................................... H01L 29/772
(52) U.S. Cl. ........................................ 257/410; 257/288
(58) Field of Search ................................ 257/288, 410, 257/411

(56) References Cited

U.S. PATENT DOCUMENTS

| | | | |
|---|---|---|---|
| 4,016,587 A | * | 4/1977 | De La Moneda |
| 5,674,788 A | * | 10/1997 | Wristers et al. |
| 5,817,536 A | * | 10/1998 | Nayak et al. |
| 5,821,172 A | * | 10/1998 | Gilmer et al. |
| 5,851,888 A | * | 12/1998 | Gardner et al. |
| 6,018,182 A | | 1/2000 | Morosawa |
| 6,033,998 A | * | 3/2000 | Aronowitz et al. |
| 6,191,463 B1 | * | 2/2001 | Mitani et al. |

FOREIGN PATENT DOCUMENTS

| JP | HEI 5-074762 | 3/1993 |
|---|---|---|
| JP | HEI 5-082777 | 4/1993 |
| JP | HEI 5-283679 | 10/1993 |
| JP | 11111845 A | * 4/1999 |

OTHER PUBLICATIONS

"Effects of boron penetration and resultant limitations in ultra thin pure–oxide and nitrided–oxide gate–films", Toyota Morimoto et al., *IEDM*, pp. 429–432, 1990.

"CMOS Technology Scaling, 0.1μm And Beyond", Bijan Davari, *IEDM*, pp. 555–558, 1996.

"Analysis of an ONO gate film effect on n– and p–MOSFET mobilities", H. Iwai et al., *1990 Symposium on VLSI Technology*, pp. 131–132.

"Hot–Electron Hardened Si–Gate MOSFET Utilizing F Implantation", Yasushiro Nishioka, et al., *IEEE Electron Device Letters*, Vo. 10, No. 4, pp. 141–143, Apr. 1989.

* cited by examiner

*Primary Examiner*—Nathan J. Flynn
*Assistant Examiner*—Kevin Quinto
(74) *Attorney, Agent, or Firm*—Birch, Stewart, Kolasch & Birch, LLP

(57) ABSTRACT

An insulated gate transistor in which nitride oxide film having a nitrogen concentration of $1\times10^{20}$ (/cm$^3$) or more and containing a halogen element is used as a gate insulator. Because the gate insulator has a nitrogen concentration of $1\times10^{20}$ (/cm$^3$) or more, boron contained in the gate electrode of the p-type transistor is never diffused into the channel. Further because a halogen element is contained in the gate insulator, transistor conductance is increased and reliability in hot carrier injection is improved. Thus, an insulated gate transistor which has a sufficiently large conductance and which is superior in reliability can be fabricated.

4 Claims, 6 Drawing Sheets

INSULATED GATE TRANSISTOR HAVING A GATE INSULATOR CONTAINING NITROGEN ATOMS AND FLUORINE ATOMS

BACKGROUND OF THE INVENTION

The present invention relates to a semiconductor device equipped with a gate insulator in an insulated gate transistor, as well as to a process for fabricating the semiconductor device.

In recent years, because of necessities for the suppression of variations in threshold voltages of transistors as well as for the suppression of the short-channel effect, there have been developed CMOS having a dual-gate structure using surface-channel type transistors that employ a gate containing N-type impurities for NMOS and a gate containing P-type impurities for PMOS. This has been reported, for example, in International Electron Devices Meeting 1996, pp. 555–558.

However, in an attempt to form the dual-gate structured CMOS with surface-channel type, transistors, there is a problem as follows. That is, when P-type doped polysilicon is used as a gate electrode, boron in the gate electrode penetrates through the gate oxide in heat treatment process for activation of impurities, reaching substrate silicon and making the threshold voltage of transistors largely changed.

For this reason, it has been reported in International Electron Devices Meeting 1990, pp. 429–432 that the penetration of boron can be suppressed by using nitride oxide as the gate insulator.

It has also been reported in IEEE Electron Device Lett. 10,141 (1989) that when polysilicon film containing no boron is used as the gate electrode, transistor characteristics and reliability are improved by introducing fluorine to the gate insulator.

However, it is reported in Symposium on VLSI technology, 1990, pp. 131–132 that using nitrided oxide film as the gate insulator would cause the mobility of transistors to be reduced, as compared with using oxide film.

In another aspect, as the surface-channel type P-type transistor, those in which polysilicon film containing boron as the P-type dopant is used as the gate electrode are the current mainstream. With such gate insulator given by silicon oxide and with fluorine contained in the gate electrode, fluorine accelerates the diffusion of boron, making it more likely that boron reaches the substrate silicon. This leads to a problem that the threshold voltage of the P-type transistor becomes more liable to vary.

In a further aspect, whereas gate insulated type transistors having a floating electrode and a control gate are used as nonvolatile memory, there has been a growing demand for transistors having a thinner gate insulator along with the scaling-down of devices. However, because a high electric field is applied to the gate insulator used in nonvolatile memory, the gate insulator would progressively deteriorate as its thickness decreases, which would cause a problem that the leak current increases. This deterioration begins to appear noticeably when the oxide film thickness becomes thinner than 10 nm, and tends to exponentially increase as the film thickness decreases.

This being the case, as a result of the inventor's keen studies with a view to preventing boron from penetrating and diffusing into the substrate, and to avoiding the reduction of the mobility of the transistors, the present invention has been achieved.

In order to achieve the afore mentioned object, there is provided an insulated gate transistor having a gate electrode on a substrate with a gate insulator interposed therebetween, wherein the gate insulator composed of silicon and oxygen contains both nitrogen atoms and halogen atoms.

Because nitrogen and a halogen element are contained in the gate insulator, interface deterioration due to the introduction of nitrogen atoms to the interface is reduced so that the interface state density is reduced, and as a result, a successful interface can be formed. Also, because the halogen element contained in the interface forms a stable bond with silicon, even carrier injection with hot carriers or the like never causes the formation of dangling bonds. As a result of this, the insulated gate transistor has an effect of improvement in transistor characteristics and reliability. In particular, in the surface-channel type PMOS, to which the penetration of boron matters, oxide film containing nitrogen is used, whereas the use of oxide film containing nitrogen would cause a mobility deterioration to occur due to a deterioration of the interface characteristics. By an arrangement that halogen atoms having an interface-defect compensation effect are contained in this oxide film, the interface characteristics are improved. Although halogen atoms, when contained, would usually cause the boron penetration to be amplified, adding a sufficient concentration of nitrogen atoms makes it possible to suppress the mobility deterioration while suppressing the boron penetration.

In one embodiment of the present invention, nitrogen atom concentration of the gate insulator is not less than $1 \times 10^{20}$ cm$^{-3}$.

Because an insulator film having a nitrogen atom concentration of $1 \times 10^{20}$/cm$^3$ or more is used for the gate insulator of the insulated gate transistor, boron contained in the gate electrode of the P-type transistor, in particular, does not diffuse into the substrate. Also, because any interface defects can be compensated by virtue of the halogen element contained in the gate insulator, the interface state density is reduced, the mobility is improved, and the transistor reliability is improved.

In one embodiment of the present invention, a source-and-drain region of the insulated gate transistor is stacked to upper than a channel portion.

For example, in a device as shown in FIG. 8, the contact hole for connecting the source-and-drain region and the upper connecting lines to each other does not need to be formed on the active region, and may be formed on the stacked layer extending up to on the device isolation region. This makes it possible to reduce the source-and-drain region width to the processible margin. That is, with the use of equipment that permits processing to a minimum processing size F, since the registration margin of photolithography for the upper pattern with the ground is generally about ⅓ F, the degree to which the source-and-drain region is ensured on the active region even with a maximum shift of registration, i.e., the gate—device isolation margin width has only to be about ⅔ F–F. Therefore, given a gate length of F, the distance from device isolation to device isolation is about ⅔ F–3 F. Like this, when the device isolation is quite near to the gate electrode, the effect of abnormal diffusion of boron becomes more noticeable due to the stresses of the gate electrode and the device isolation. By applying this invention, the diffusion of boron can be inhibited without causing any deterioration of transistor characteristics. Besides, the transistor reliability can also be improved.

In one embodiment of the present invention, the insulated gate transistor comprises a floating gate electrode and a control gate electrode provided on the floating gate electrode with an interlayer insulator interposed therebetween. Because the transistor of a structure having a floating gate electrode and a control gate electrode has a necessity that a high electric field be applied thereto, the reliability of the gate insulator is of particular importance.

In particular, in regions where the film thickness of the gate insulator is not more than 10 nm, there arises a problem that the leak current flowing through the insulator film increases after the application of the high electric field. In this invention, the increase of the leak current in the gate insulator can be suppressed by the halogen element contained in the insulator film.

In one embodiment of the present invention, the halogen atom is fluorine. In particular, fluorine atoms, by virtue of being small in atomic radius, can improve the transistor characteristics without disturbing the bonded state of the atoms in the insulator film. Also, because fluorine and silicon can obtain a stable bond by virtue of large bond energy therebetween, an insulator film superior in reliability can be formed.

In one embodiment of the present invention, film thickness of the gate insulator is not less than 0.5 nm and not more than 5 nm. Even when the film thickness of this gate insulator is not less than 0.5 nm, a stable film formation is enabled by this invention. Also, in regions where the film thickness of the gate insulator is not more than 5 nm, boron would diffuse in the gate insulator with the occurrence of boron penetration when no nitrogen is contained in the gate insulator, whereas the boron penetration does not occur in this invention because nitrogen atoms are contained. Thus, it becomes possible to improve the transistor characteristics by the halogen element.

Also, there is provided process for fabricating an insulated gate transistor having a gate electrode on a substrate with a gate insulator interposed therebetween, comprising: a step for forming silicon oxide containing nitrogen atoms as the gate insulator; and a step for introducing a halogen element to the silicon oxide containing the nitrogen atoms. In this case, as the gate insulator, silicon oxide containing nitrogen is formed by reacting at temperatures of about 700–1200° C. nitrogen monoxide gas, dinitrogen monoxide gas or ammonia gas on the silicon oxide. In this process, reaction temperature and reaction time are controlled so that nitrogen concentration in the silicon oxide becomes $1\times10^{20}/cm^3$ or more. After that, the halogen element is introduced into the insulator film by using nitrogen trifluoride, nitrogen trichloride or other gas containing fluorine or chlorine, which is a halogen element. It is noted here that the halogen element may also be introduced into the gate insulator by ion-implantation of fluorine or chlorine in later steps. In the case where the halogen element is introduced with a gas, the optimum value of the halogen element contained in the insulator film is controlled by controlling the reaction temperature and reaction time; or in the case where the halogen element is introduced by ion implantation, the optimum value is controlled by controlling the injection dose. As a result, silicon oxide having a nitrogen concentration of $1\times10^{20}/cm^3$ or more and containing a halogen element can be formed.

In one embodiment of the present invention, the step for forming silicon oxide containing nitrogen atoms comprises a step of forming silicon oxide and a step of nitriding the silicon oxide. First, silicon oxide is formed with an oxygen atmosphere or a water vapor atmosphere. Then, the silicon oxide is nitrided with nitrogen monoxide, dinitrogen monoxide, ammonia or other gas, by which silicon oxide containing nitrogen is formed. By forming silicon oxide containing nitrogen in this way, nitrogen-containing silicon oxide uniform in both film thickness and nitrogen content can be formed within the wafer surface.

In one embodiment of the present invention, the step of forming the silicon oxide containing nitrogen atoms is a step of forming the silicon oxide by using nitrogen monoxide. With the use of nitrogen monoxide, nitrogen-containing silicon oxide that has been controlled in nitrogen content can be formed by a single-step process.

In one embodiment of the present invention, the step of forming the silicon oxide containing nitrogen atoms is a step of forming silicon oxide with dinitrogen monoxide and then nitriding the silicon oxide with nitrogen monoxide or ammonia gas.

First, by forming nitrogen-containing silicon oxide with dinitrogen monoxide, nitrogen-containing silicon oxide which is thinner in film thickness due to a slow oxidation rate can be formed with good control. Then, by nitriding with the use of dinitrogen monoxide or ammonia gas, the nitrogen concentration can be enhanced.

In one embodiment of the present invention, the step of introducing a halogen element is a step of ion implantation of fluorine.

Because of fluorine's high diffusion rate, fluorine can be easily introduced into the insulator film by injecting fluorine into the gate electrode and performing heat treatment therewith. Also, because of fluorine's small atomic radius, transistor characteristics can be improved without disturbing the bonded state of atoms in the insulator film. Further, because fluorine and silicon can obtain a stable bond by virtue of large bond energy therebetween, an insulator film superior in reliability can be formed.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Embodiment 1

Figure 1:
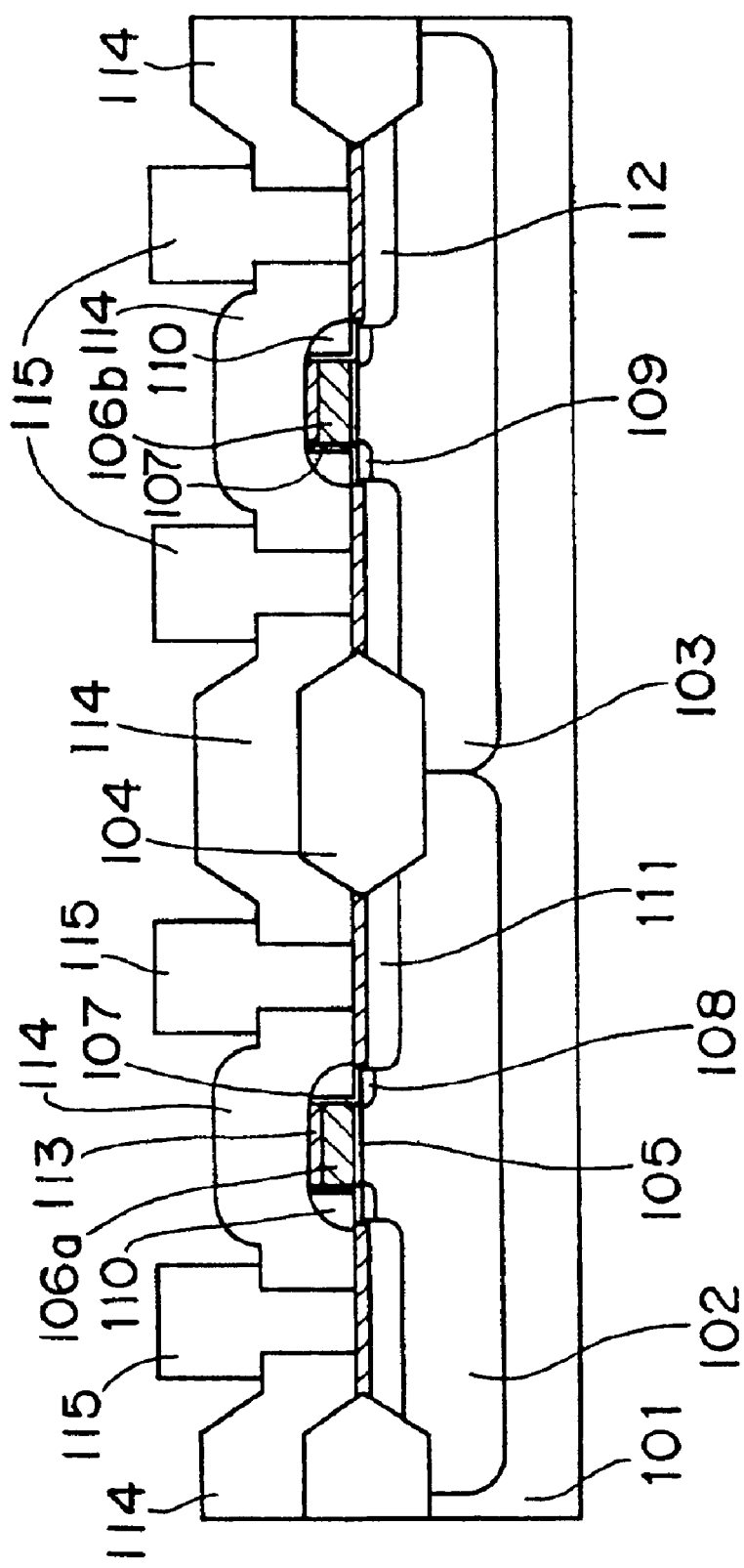
FIG. 1 is a view showing a dual-gate CMOS insulated gate transistor semiconductor device according to the present invention.

FIG. 1 shows a dual-gate CMOS insulated gate transistor according to the present invention. On a semiconductor substrate 101, were formed a p-well 102, an n-well 103 and a device isolation region 104. In the p-well 102 is formed an NMOS transistor comprising a gate insulator 105, an n+ polycrystalline gate electrode 106a, a shallow n-type diffusion layer 108, an injection protective film 107, a side wall spacer 110, a deep n-type diffusion layer 111, an interlayer insulator 114 and metallization 115. In the n-well 103 is formed a PMOS transistor comprising a gate insulator 105, a p+ polycrystalline gate electrode 106b, a shallow p-type diffusion layer 109, an injection protective film 107, a side wall spacer 110, a deep p-type diffusion layer 112, an LDD region 109, a silicide film 113, the interlayer insulator film 114 and the metallization 115. It is noted here that the gate insulator is a silicon oxide film having a nitrogen concentration of $1 \times 10^{20}/cm^3$ or more and containing fluorine atoms.

Figure 2:
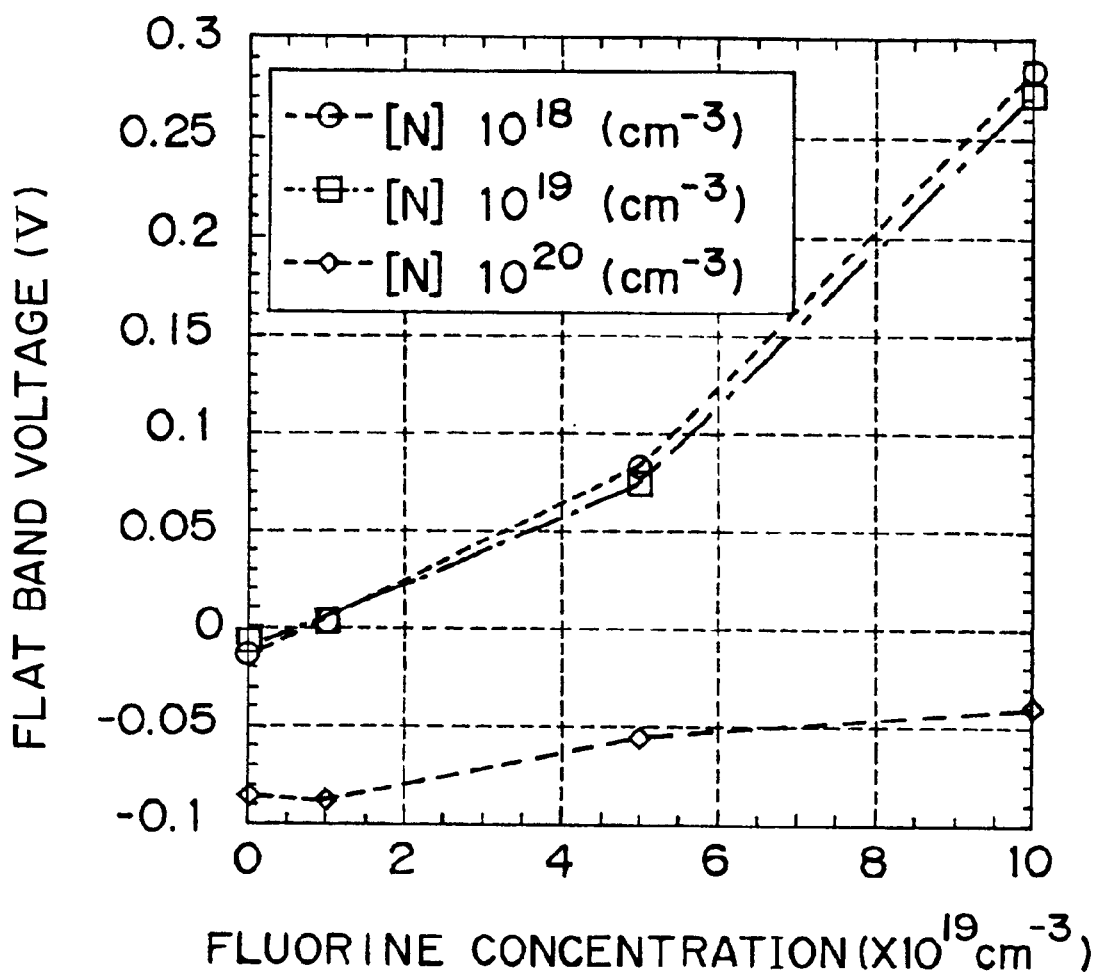
FIG. 2 is a chart showing a relationship between fluorine concentration and flat band voltage in a PMOS transistor in an embodiment of the invention.

FIG. 2 shows a graph of nitrogen-concentration dependence of the flat band voltage of a PMOS transistor at a gate-insulator thickness of 2.5 nm in an insulated gate transistor. It is noted that the activation heat treatment of impurities injected into the source and drain portions is performed at a temperature of 850° C. and for a time period of 30 min. in a nitrogen atmosphere. As shown in the figure, with a nitrogen atom concentration of $1 \times 10^{20}/cm^3$ or more, a characteristic that the flat band voltage less changes even if fluorine is injected is obtained, from which it can be understood that boron contained in the gate electrode in the P-type transistor scarcely diffuses up to the channel region of the transistor. As shown in FIG. 2, in particular, with the nitrogen atom concentration equal to or more than $1 \times 10^{20}$ $(/cm^3)$, an abrupt improvement in the characteristic can be seen.

In this case, applicable gate insulator thickness is within a range from 0.5 nm, a value that allows a stable film formation to be achieved, to 5 nm, a value at which penetration of boron matters.

Figure 3:
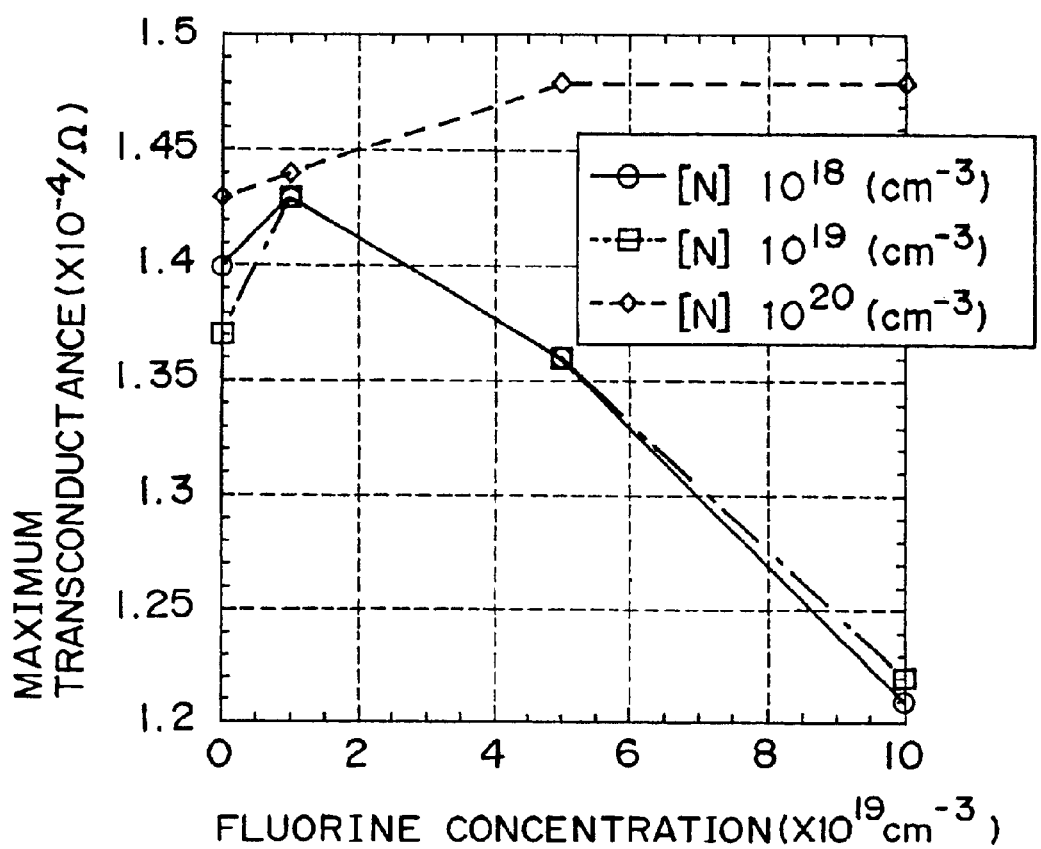
FIG. 3 is a chart showing a relationship between fluorine concentration and channel conductance in a PMOS transistor in an embodiment of the invention.

FIG. 3 is a graph showing the fluorine concentration dependence of the maximum conductance of the P-type transistor in the gate insulator when the gate insulator has a film thickness of 2.5 nm in an insulated gate transistor. With the fluorine element contained, as shown in FIG. 3, because interface defects can be compensated, the interface state density lowers and the mobility improves. In this connection, because $1 \times 10^{20}/cm^3$ or more of nitrogen is contained in the insulator film, increase of boron penetration due to the fluorine of the halogen element is suppressed as shown in FIG. 2. Besides, the sub-threshold coefficient of the transistor can also be reduced thanks to the formation of a successful interface.

Halogen element and silicon can obtain a stable bond by virtue of their large bond energy. Therefore, deterioration of transistor characteristics due to hot carrier injection, which matters to micro-transistors, can be reduced so that an insulator film superior in reliability can be formed.

Figure 7:
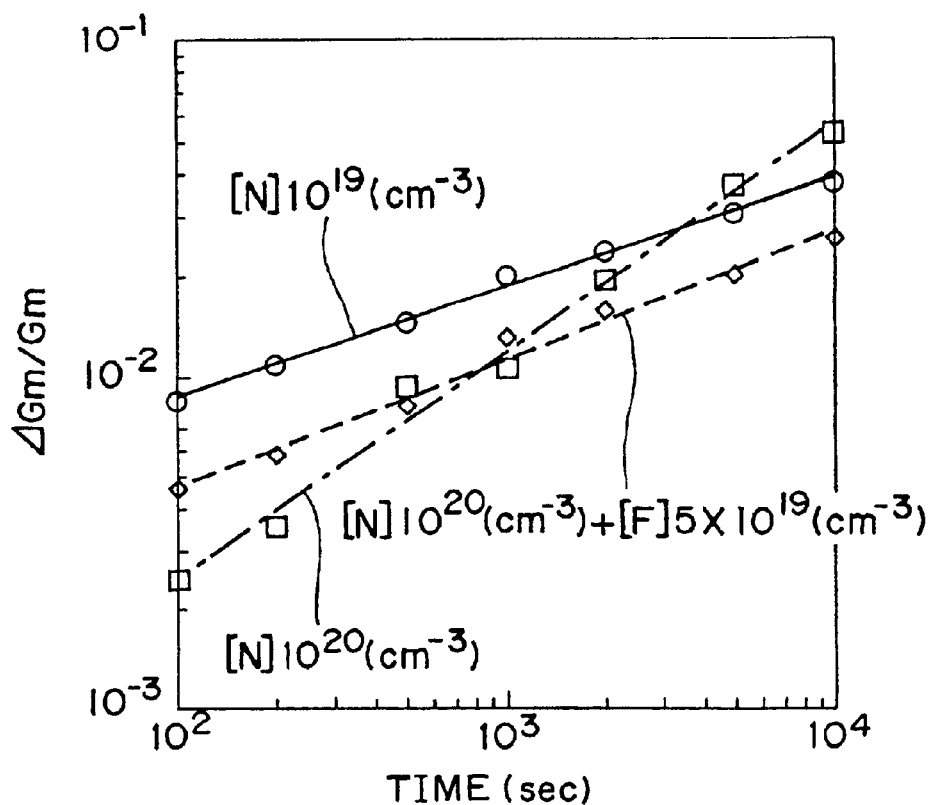
FIG. 7 is a chart showing results of hot carrier stress in an NMOS transistor according to the invention.

Results of hot carrier stress of an n-MOS transistor with the addition of fluorine, one of the halogen elements, is shown in FIG. 7. In this case, the stress voltage was set to the drain voltage, 3 V, and the gate voltage was set to such a voltage that the substrate current would become a maximum. Whereas using nitrided oxide having a nitrogen concentration of $1 \times 10^{20}/cm^3$ as the gate insulator would cause the deterioration of transconductance to increase, the addition of fluorine to the nitrided oxide having a nitrogen concentration of $1 \times 10^{20}/cm^3$ reduced the deterioration of transconductance.

Although polysilicon is used as the gate electrode in this embodiment, polycrystalline germanium, polysilicon germanium or the like may also be used. Further, tungsten or other metals, a layered structure of polycrystalline film and metal, or the like may also be used.

Embodiment 2

Figure 4:
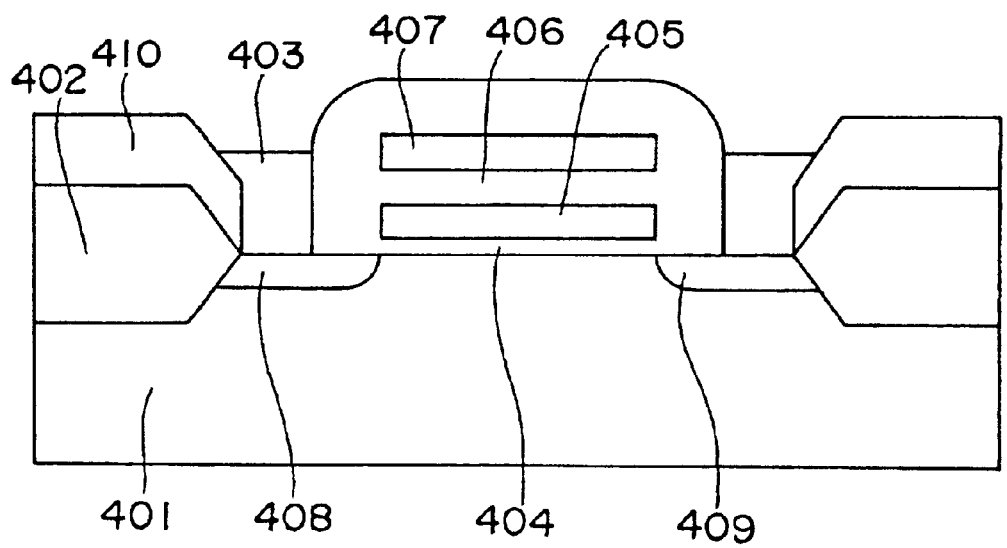
FIG. 4 is a view showing an insulated gate transistor semiconductor device with a memory cell having a floating gate and a control gate according to the invention.

FIG. 4 shows a sectional view of a memory cell using an insulated gate transistor having a floating gate electrode and a control gate electrode provided on the floating gate with an interlayer insulator interposed therebetween. In FIG. 4, are shown a silicon substrate 401, a device isolation region 402, an electrode 403 and a gate insulator 404. In this case, the gate insulator is a silicon oxide film having a nitrogen atom concentration of $1 \times 10^{20}/cm^3$ or more and containing halogen atoms. Further shown in the figure are a floating gate electrode 405, an interlayer insulator 406, a control gate electrode 407, a source region 408, a drain region 409 and an insulator 410.

For the insulated gate transistor with the memory cell of this embodiment, if silicon oxide of conventional use is used as the gate insulator 404, a high voltage would be applied to the gate insulator in rewrite process. Due to this, there has been a problem that leak current would increase with increasing number of repetitions of rewrite in regions where the gate insulator film thickness is not more than 10 nm. However, in the gate insulator of this embodiment, by virtue of the use of silicon oxide having a nitrogen atom concentration of $1 \times 10^{20}/cm^3$ or more and halogen atoms as the gate insulator, nitrogen atoms and a halogen element contained in both the gate insulator and the interface can form a stable bond at the interface between the channel and the gate insulator. This prevents the deterioration of the interface due to hot carriers that would be produced during rewrite operations of the memory cell, so that characteristic deterioration was able to be reduced to a great extent. As a result of this, the number of repetitions of rewrite of the memory cell was dramatically improved. In addition, it is preferable to use a gate insulator having a film thickness of 0.5 nm or more that allows a stable film formation.

Applying this technique makes it possible to realize a thinner gate insulator. As a result, it has been enabled to scale down devices and to form memory devices of higher integration.

Embodiment 3

Figure 5A:
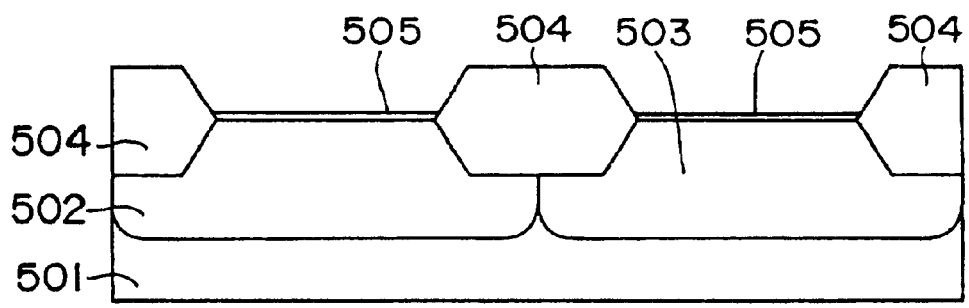
FIGS. 5A–5C are views showing a method for fabricating a dual-gate CMOS semiconductor device according to the invention.
Figure 5B:
Figure 5B:
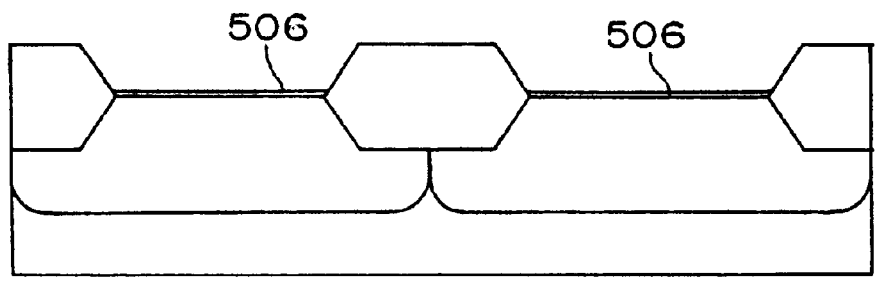
Figure 5C:
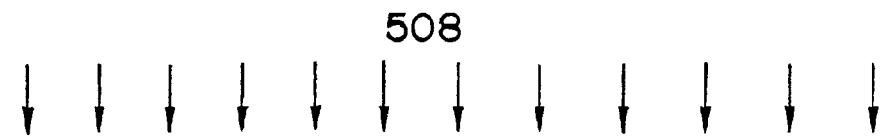
Figure 5C:
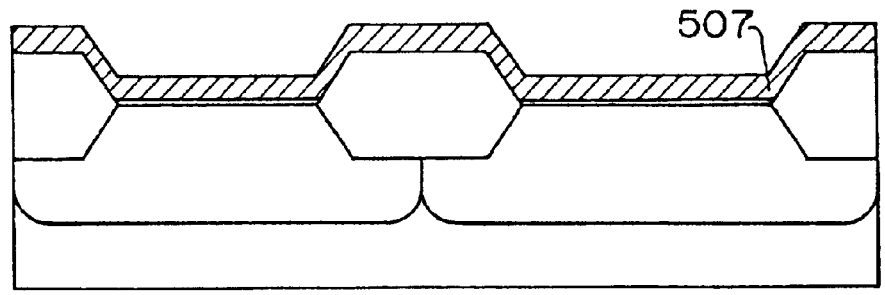

FIGS. 5A to 5C show fabrication process of a dual-gate CMOS semiconductor device according to the present invention. On a silicon semiconductor substrate 501, were formed a p-well 502, an n-well 503 and field oxide (device isolation region) 504.

Next, for threshold voltage control and short-channel effect prevention, impurity ion-injection was performed by injecting boron for the NMOS device (p-well 502) and injecting phosphorus for the PMOS device (n-well 503). Next, a cleaning process with an about 80° C. mixed solution of ammonia and hydrogen peroxide water, and a cleaning process with an about 80° C. mixed solution of hydrochloric acid and hydrogen peroxide water, were performed prior to the formation of gate oxide, and then the silicon surface was cleaned with an about 1% hydrogen fluoride water. The cleaning processes are not limited to cleaning with these solutions. After the cleaning processes, the silicon surface was oxidized at a temperature of about 800° C. in an oxidizing atmosphere, by which silicon oxide 505 having a film thickness of about 2.5 nm was formed. A sectional view of the process up to this is shown in FIG. 5A.

After that, a silicon-oxide nitriding step 506 was performed in an ammonia-gas or nitrogen-monoxide atmosphere at a temperature of about 900° C. By this step, gate oxide 506 having a nitrogen concentration of $1 \times 10^{20}$ (/cm$^3$) or more was formed. Otherwise, for the formation of the gate oxide 505 containing nitrogen, it is also possible to form gate oxide by oxidizing the silicon surface with nitrogen monoxide or nitrogen dioxide, thereby forming silicon oxide containing a trace amount of nitrogen, and then by nitriding the silicon oxide in an ammonia-gas or nitrogen-monoxide atmosphere. It is still also possible that the gate oxide containing nitrogen is formed by a single-step process by controlling-oxidation temperature and oxidation time with oxidation in a nitrogen monoxide atmosphere. A sectional view of the process up to this is shown in FIG. 5B.

After this, polysilicon film 507 was deposited to about 100–300 nm (preferably, 250 nm) at a temperature of about 620° C. by LPCVD process. Subsequently, a step 508 was performed in which fluorine or chlorine, which is a halogen element, was injected to a rate of about $5 \times 10^{14}$ (/cm$^2$). This halogen element injection step may also be performed after patterning a polysilicon film into a desired pattern through known process including photolithography and etching steps. In particular, fluorine is most preferable because the small atomic radius of fluorine allows transistor characteristics to be improved without disturbing the atomic bond in the insulator film, and because a stable bond that can be obtained by virtue of large bond energy between fluorine and silicon allows an insulator film superior in reliability to be formed.

In addition, although ion injection is used for the introduction of the halogen element into the gate insulator in this embodiment, it is also possible to introduce fluorine or chlorine into the gate insulator for the formation of gate oxide by treatment at temperatures of about 600–1000° C. with the use of nitrogen trifluoride, nitrogen trichloride or other gas. In the formation of the PMOS transistor in dual-gate CMOS, if the introduction of impurities to the source/drain and the gate is performed simultaneously by ion injection, where $BF_2$ is used as the injected ion seed, fluorine is introduced to the gate electrode. In this case, however, there are limitations on injection amount and injection energy, as compared with the fluorine introduction process according to the invention. The reason of this is that because higher than certain level of injection amount and injection energy are required to form a low-resistance gate electrode, characteristic deterioration would arise due to the occurrence of crystal defects and the mixing of high-concentration fluorine. A sectional view of the process up to this is shown in FIG. 5C.

Next, the polysilicon film was patterned into a desired pattern through known process including photolithography and etching steps. After that, silicon oxide present on the polysilicon film (gate electrode) surface and the activation region (source and drain) was completely removed with hydrofluoric acid solution or the like, and then silicon nitride was deposited to about 3–30 nm (preferably, 5 nm) as an impurity injection protective film. In addition, although silicon oxide may be used as the injection protective film, yet in this case oxygen would be knocked on from the silicon oxide into the semiconductor during the ion injection and, moreover, when silicide formation is performed in subsequent processes, oxygen would inhibit the silicide-forming reaction. Due to this reason, silicon nitride was used as the injection protective film in this embodiment. Otherwise, ions may also be injected directly without any injection protective film.

Next, in order to form a shallow junction in the vicinity of the channel in the NMOS device region, the PMOS device was coated with a photoresist film by photolithography process, and the NMOS device was subjected to ion injection with arsenic used as impurity ions that behave as a donor in the silicon semiconductor at an energy of 2–30 keV and an injection amount of about $0.5–5 \times 10^{14}$ (/cm$^2$). When antimony ions are used as the impurity for the NMOS device, the injection is performed at an energy of 3–35 keV and an injection amount of about $0.5–5 \times 10^{14}$ (/cm$^2$). In this case, a shallow p-type diffusion layer 509 is formed in the PMOS device region.

Next, after the removal of the photoresist film, for the formation of a shallow junction in the vicinity of the channel in the PMOS device region, the NMOS device was coated with a photoresist film by photolithography process, and the PMOS device was subjected to ion injection with $BF_2$ ions that behave as an acceptor in the silicon semiconductor at an energy of 5–40 keV and an injection amount of about $0.5–5 \times 10^{14}$ (/cm$^2$). In this connection, In ions or the like may be injected instead of $BF_2$ ions. In this case, a shallow n-type diffusion layer 510 is formed in the PMOS device region.

Next, a side wall spacer 511 was formed on a side wall of the gate electrode. After silicon nitride film was deposited to about 100–200 nm, etching-back process was performed by reactive ion etching (RIE) based on $C_4F_8+CO$ gas having a selection ratio of about 50–100 with respect to the silicon oxide of the silicon nitride film until the surface of the silicon oxide on the device isolation region was exposed, by which a side wall spacer 511 was formed. It is noted here that as the side wall spacer, silicon nitride film is preferable for the reduction of bird's beak due to a later oxidation step, but a two-layer structured film of silicon oxide and silicon nitride is also allowable.

After that, a source-and-drain diffusion layer, which was a deep junction, was formed. The PMOS device was coated with a photoresist film by photolithography process, and the NMOS device was subjected to ion injection 512 by injecting phosphorus, which behave as a donor in the silicon semiconductor, at an energy of 15–50 keV and an injection amount of about $1–5 \times 10^{15}$ (/cm$^2$).

Figure 6D:
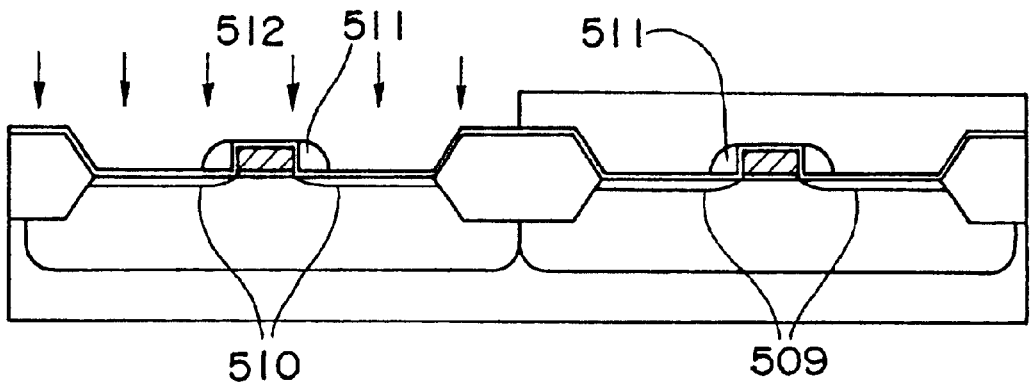
FIGS. 6D–6F are views showing a method for fabricating a dual-gate CMOS semiconductor device according to the invention.

In addition, in Embodiment 1, experiments were carried out at an energy of 30 keV and an injection amount of $3 \times 10^{15}$ (/cm$^2$). A sectional view of the process up to this is shown in FIG. 6D.

Figure 6E:
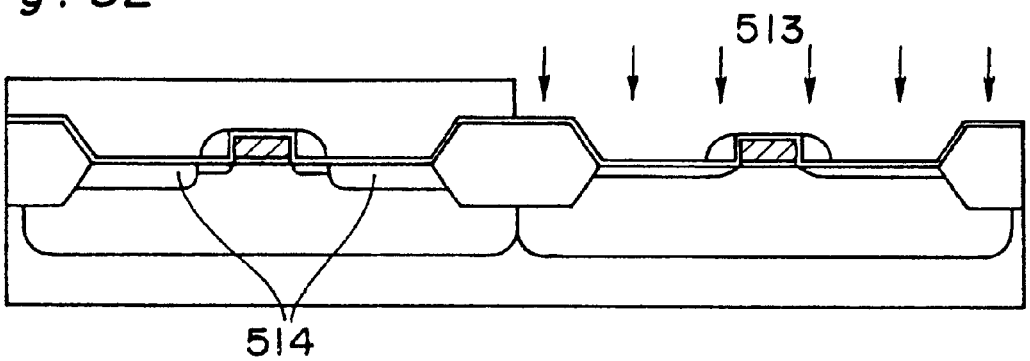

After the removal of the photoresist film, the injected impurities were activated by performing an about 850–900° C. annealing process in a nitrogen atmosphere, by which a shallow diffusion layer 510 and a deep diffusion layer 514 were formed in the NMOS device. In the PMOS device, on the other hand, boron was activated, by which a shallow p-type diffusion layer 509 was formed. Now, this time, the NMOS device was coated with a photoresist film, and the PMOS device was subjected to ion injection with silicon ions under the conditions of an injection energy of 30 keV and an injection amount of $1 \times 10^{15}$ (/cm$^2$) for the purpose of preventing the channeling effect. Then, ion injection 513 was performed by injecting boron, as impurity ions that behave as an acceptor in the silicon semiconductor, at an energy of 10–30 keV and an injection amount of about 1–5×10$^{15}$ (/cm$^2$). A sectional view of the process up to this is shown in FIG. 6E.

Figure 6F:
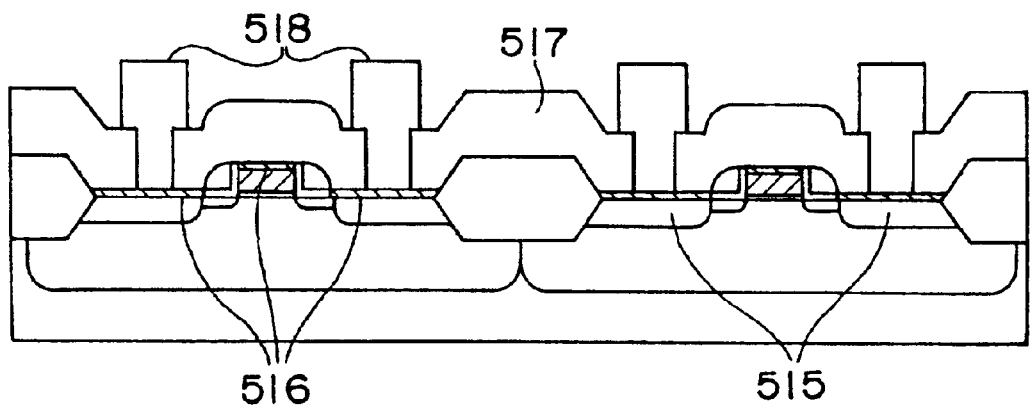

Next, after the removal of the photoresist film, the injected impurities were activated by rapid thermal annealing (RTA; 1000° C., 10 sec.) process, by which a deep source-and-drain diffusion layer 515 was formed in the PMOS device. After that, through known processes such as a silicide step, silicide 516 as well as an interlayer insulator 517 and metallization 518 and the like were formed on the gate electrode top surface and the source-and-drain region. Thus, a desired dual-gate CMOS semiconductor device as shown in FIG. 6F was able to be formed.

If BF$_2$ is used for the injection into the source-and-drain part and the gate electrode in the PMOS transistor of a dual-gate CMOS, fluorine would mix into the source-and-drain part, which would cause problems of resistance increase, thermal resistance deterioration, junction leak increase and the like during the silicide formation.

In the method of the present invention, when fluorine is introduced prior to the gate patterning, the mixing of fluorine into the source-and-drain part never occurs, thus eliminating the occurrence of the above problems. Also, halogen element and silicon can obtain a stable bond because of their large bond energy. Therefore, deterioration of transistor characteristics due to hot carrier injection, which matters to micro-transistors, can be reduced so that an insulator film superior in reliability can be formed.

Embodiment 4

Figure 8:
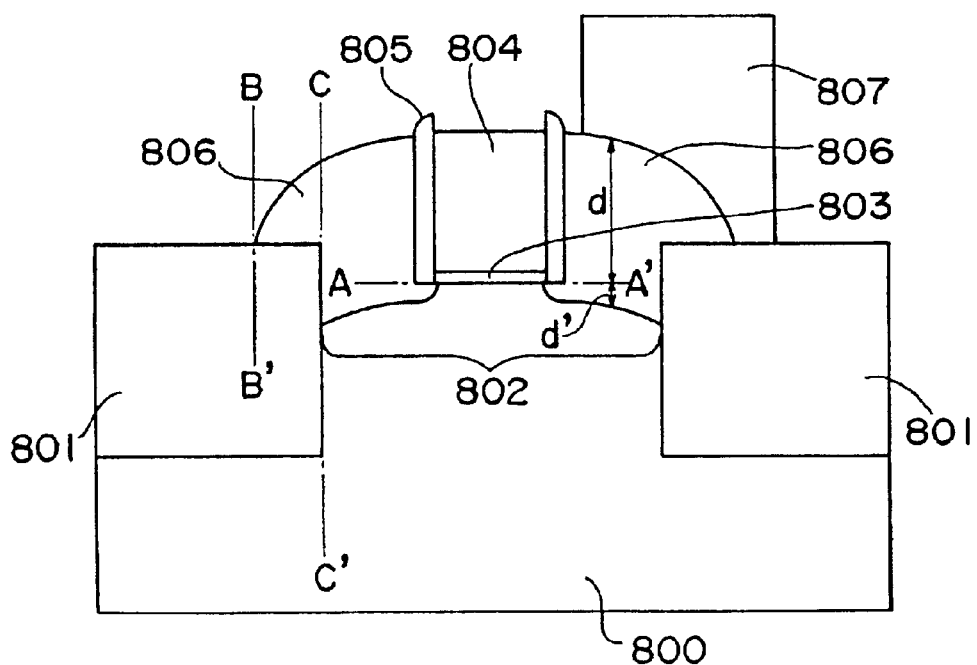
FIG. 8 is a view showing a transistor using a layered structure for the source and drain portions in an embodiment of the invention.

FIG. 8 is a vertical sectional view of an insulated gate transistor which is a fourth embodiment of the present invention, where the transistor is cut vertically to the longitudinal direction of the gate electrode.

As shown in FIG. 8, this device is a MIS semiconductor device formed on an active region 802 of a semiconductor substrate 800, which consists roughly of a device isolation region 801 and the active region 802. Denoted by numeral 803 is a gate insulator comprising a nitrided oxide film having an interface nitrogen concentration of 1×10$^{20}$/cm$^3$. This device has such a configuration that a source-and-drain region 806 is present so as to adjoin a gate-electrode side wall insulator film 805 on both sides of a gate electrode 804 and to extend up to above a surface (interface between gate insulator 803 and active region 802) A–A' of the active region 802, and that a boundary (C–C') between active region and device isolation region is present between an end of the gate electrode 804 and an end (B–B') of the source-and-drain region, and moreover that a distance (d) between the active region surface A–A' of the semiconductor substrate and the source-and-drain region surface in a vertical section resulting when the device is cut vertically to the longitudinal direction of the gate electrode increases along a direction from the device isolation region toward the gate electrode side.

That is, a contact hole 807 for connecting the source-and-drain region 806 and upper connecting lines do not need to be formed on the active region 802, and may be formed so as to stretch onto a stacked layer that extends up to on the device isolation region 801. Therefore, it becomes possible to reduce the source-and-drain region width to the processible margin. With the use of equipment that permits processing up to a minimum processing size F, since the registration margin of photolithography for the upper pattern with the ground is generally about ⅓ F, the degree to which the source-and-drain region is ensured on the active region even with a maximum shift of registration, i.e., the gate—device isolation margin width (a distance from the end face of the gate electrode 804 to the C–C' surface) has only to be about ⅔ F–F. In other words, the structure may be that the active region is covered with electrically insulated gate, source and drain three regions, which is done without forming any vertical step gap between the gate region and the device isolation region.

Also, in this structure, with respect to the source-and-drain region, the surface of the source-and-drain region 806 is present increasingly upper than the active region surface A–A' with increasing nearness to the gate electrode. As a result of this, when the doping of impurities into the source-and-drain region 806 is performed by ion injection process, a depth (d') from the active region surface A–A' to the junction of the source-and-drain region and the semiconductor substrate (in the case of ordinary CMOS, a well region of a conducting type reverse to the source-and-drain region) becomes increasingly shallow with increasing nearness to the gate electrode 804, producing an effect that the short-channel effect involved in scaling-down can be effectively suppressed.

In the transistor device having the above structure, the contact hole 807 for connecting the surface of the source-and-drain region 806 and the upper connecting lines to each other is only required that at least part thereof is present on the surface of the source-and-drain region. As a result, for this device, it becomes possible to increase the contact area of the source-and-drain region with the contact hole relative to the occupancy area of the source-and-drain region on the active region 802, so that the contact resistance can be lowered. As a further effect, it also becomes possible to reduce the occupancy area of the device, particularly of the source-and-drain region, regardless of the contact size. This effect makes it possible to reduce the junction area of the source-and-drain region and the semiconductor substrate (in the case of ordinary CMOS, a well region of a conducting type reverse to the source-and-drain region) without sacrificing the contact resistance, which in turn makes it possible to effectively reduce the junction capacitance. That is, in this structure, a reduction in occupancy area, a reduction in parasitic capacitance (junction capacitance), and a reduction in parasitic resistance are enabled without sacrificing the contact resistance, so that a very large transconductance can be obtained.

In the transistor device of this structure, the ratio of high-resistance region (distance d' from channel to contact) occupying in the current-flowing path is very low, so that the parasitic resistance of the source-and-drain region is reduced, compared with ordinary structure. Further, the current-flowing path becomes increasingly wider with increasing nearness to the contact hole 807 from the source-and-drain region in the vicinity of the channel region. This effect also contributes to quite a small parasitic resistance. By these effects, the current driving power of the device is increased and the transconductance is improved.

However, in the device of this structure, given a gate length F, the distance from one device isolation region to another device isolation region is about ⅔ F–3 F. Like this, if device isolation is considerably near to the gate electrode, applying a gate insulator of the prior art would result in a more noticeable influence of abnormal diffusion of boron toward the channel direction, due to the stresses of the gate electrode and the device isolation.

Therefore, in a device of this structure, deterioration of the S factor in the PMOS transistor characteristics as well as deterioration of transistor characteristics such as increase in the off-leak current become more noticeable, as compared with devices of ordinary structure (devices in which the gate—device isolation margin is formed at a width of 2.5 F–3 F). However, in this embodiment, a gate insulator composed of nitrided oxide having a peak nitrogen concentration of $1\times10^{20}/\text{cm}^3$ is formed, and by providing a peak nitrogen concentration of $1\times10^{20}/\text{cm}^3$ or more in the gate insulator, partial abnormal accelerated diffusion of boron from the source-and-drain part can be suppressed as in the first embodiment.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An insulated gate transistor having a gate electrode on a substrate with a gate insulator interposed therebetween, wherein the gate insulator including silicon and oxygen contains both nitrogen atoms and halogen atoms, and wherein nitrogen atom concentration of the gate insulator is within a range of $1\times10^{18}$ cm$^{-3}$–$1\times10^{20}$ cm$^{-3}$ and maximum fluorine atom concentration of the gate insulator is within a range of $1\times10^{18}$ cm$^{-3}$–$6\times10^{19}$ cm$^{-3}$.

2. The insulated gate transistor according to claim 1, wherein the gate electrode contains boron, and the boron does not diffuse into the substrate.

3. The insulated gate transistor according to claim 1, wherein the gate insulator has a film thickness of about 0.5–5 nm.

4. The insulated gate transistor according to claim 1, wherein the gate electrode comprises a polycrystalline material that is at least one selected from the group consisting of polysilicon, polycrystalline germanium and polysilicon germanium.

* * * * *